United States Patent [19]
Brooks

[11] Patent Number: 5,107,227
[45] Date of Patent: Apr. 21, 1992

[54] INTEGRATABLE PHASE-LOCKED LOOP

[75] Inventor: David R. Brooks, Perth, Australia

[73] Assignee: Magellan Corporation (Australia) Pty. Ltd., Western Australia, Australia

[21] Appl. No.: 499,308

[22] PCT Filed: Nov. 17, 1988

[86] PCT No.: PCT/AU88/00445
§ 371 Date: May 15, 1990
§ 102(e) Date: May 15, 1990

[87] PCT Pub. No.: WO89/05063
PCT Pub. Date: Jun. 1, 1989

[30] Foreign Application Priority Data
Feb. 8, 1988 [AU] Australia .................. PI/6631
Apr. 22, 1988 [AU] Australia .................. PI7879

[51] Int. Cl.⁵ ......................................... H03L 7/00
[52] U.S. Cl. ..................................... 331/8; 331/17
[58] Field of Search ................ 331/1 A, 8, 14, 17, 331/25

[56] References Cited

U.S. PATENT DOCUMENTS

| | | |
|---|---|---|
| 3,805,183 | 4/1974 | Lance .................. 331/25 X |
| 3,909,700 | 9/1975 | Ferro . |
| 4,350,975 | 9/1982 | Haque et al. . |
| 4,392,113 | 7/1983 | Jackson . |
| 4,409,500 | 10/1983 | Welland . |
| 4,412,344 | 10/1983 | Mauthe et al. . |
| 4,519,083 | 5/1985 | Hanson . |
| 4,519,086 | 5/1985 | Hull et al. . |
| 4,531,084 | 7/1985 | Hoffman . |
| 4,538,282 | 8/1985 | Hochscild . |
| 4,559,634 | 12/1985 | Hochschild . |
| 4,565,976 | 1/1986 | Campbell . |
| 4,571,731 | 2/1986 | Klinkovsky et al. . |
| 4,626,798 | 12/1986 | Fried . |
| 4,656,493 | 4/1987 | Adler et al. . |
| 4,694,261 | 9/1987 | Ewen et al. . |
| 4,700,286 | 10/1987 | Bingham . |
| 4,715,000 | 12/1987 | Premerlani . |
| 4,716,514 | 12/1987 | Patel . |
| 4,731,592 | 3/1988 | Sato et al. .................. 331/117 R X |
| 4,751,565 | 6/1988 | Emmons et al. . |

FOREIGN PATENT DOCUMENTS

| | | |
|---|---|---|
| 202015 | 11/1986 | European Pat. Off. . |
| 55-99840 | 7/1980 | Japan . |
| 56-24828 | 2/1981 | Japan . |
| 57-59475 | 4/1982 | Japan . |
| 57-11128 | 7/1982 | Japan . |
| 57-84625 | 5/1983 | Japan . |
| 58-95430 | 6/1983 | Japan . |
| 60-152269 | 8/1985 | Japan . |
| 61-274423 | 4/1986 | Japan . |
| 62-58879 | 3/1987 | Japan . |
| 63-85368 | 4/1988 | Japan . |
| 63-151109 | 6/1988 | Japan . |
| WO88/01448 | 2/1988 | PCT Int'l Appl. . |
| 1226596 | 4/1986 | U.S.S.R. . |
| 1325644 | 7/1987 | U.S.S.R. . |
| 1363406 | 12/1987 | U.S.S.R. . |
| 1127579 | 9/1968 | United Kingdom . |

Primary Examiner—Robert J. Pascal
Attorney, Agent, or Firm—Banner, Birch, McKie & Beckett

[57] ABSTRACT

An integratable phase locked loop (IPLL) comprising sampled data filter means adapted to receive a first reference signal, the filter means sampling the first reference signal (Ref In) to provide a second reference signal (Control Volts Out), and voltage or current controlled oscillator (VCO) means adapted to receive said second reference signal, the second signal serving to regulate the frequency of oscillation of the oscillator, the oscillator providing as an output a digital signal which is fed back to the filter means to provide a clock signal (CLK) for said sampling.

12 Claims, 4 Drawing Sheets

INTEGRATABLE PHASE-LOCKED LOOP

RELATED APPLICATIONS

The specification lodged in respect of this application is a cognate of the disclosures in Australian Provisional Patent Application No. PI 5477, entitled "Integratable Phase Locked Loop", filed Nov, 18, 1987, and Australian Provisional Patent Application No. PI 6631, entitled "Calibrator", filed Feb. 8, 1988, and Australian Provisional Patent Application No. PI 7879, entitled "A Modified Oscillator And Integratable Phase Locked Loop", filed Apr. 22, 1988, all the aforementioned Applications having been lodged in the name of the present Applicant.

FIELD OF INVENTION

The present invention relates to an integratable phase-locked loop (IPLL) for use in electrical or electronic circuit applications. More specifically, the present invention relates to a phase-locked loop (PLL) suitable for Very Large Scale Integration (VLSI implementation). Most specifically, the present invention relates to a substantially totally integratable PLL. The IPLL of the present invention has application in frequency synthesis and signal demodulation.

PRIOR ART

A prior art Phase Locked Loop (PLL) comprises at least three elements; a Voltage (or Current) Controlled Oscillator (VCO), a Phase Detector or Comparator (PD), and a Low Pass Filter (LPF). These elements are connected in a ring formation, whereby the PD measures the difference in phase between an external Reference signal and the VCO's output, and this difference filtered by the LPF serves to adjust the frequency of the VCO, so as to keep it in synchronism with the Reference signal. Optionally, a Frequency Divider may be connected at the output of the VCO, which then runs at a multiple of the Reference frequency, and the entire PLL constitutes a frequency multiplier. This type of circuit is described, inter alia, in "Phase-Locked Loops: Theory, Design & Applications", Best R. E., McGraw Hill 1984. FIG. 1 shows a prior art PLL.

Other prior art PLL circuits are exemplified by "Hochschild" in U.S. Pat. No. 4,538,282, "Klinkovsky, Severin" in U.S. Pat. No. 4,571,731, and "Fried" in U.S. Pat. No. 4,626,798.

Prior art PLL's known to Applicant do not in fact achieve the goal of total integration, in that they integrate many but not all components on the VLSI chip.

U.S. Pat. No. 4,626,798 discloses a PLL which achieves total integration, but it is only suitable for use at extremely high frequencies (quoted as above 100 MHz). Not only are lower frequencies more commonly required, but very high frequencies require specialised circuit techniques, for example Emitter-Coupled Logic, which is both costly to produce and consumes large amounts of electrical power in use. At the high frequencies disclosed in U.S. Pat. No. 4,626,798, use is made of the resistance of the ordinary circuit wiring to form the LPF, (page 5, lines 45 to 50). This is not available at lower frequencies, where the values required for such resistors become excessive. Further, the electrical value of such wiring resistance is poorly controlled in most practical VLSI fabrication processes, which can lead to poor control of the LPF characteristics. This may lead to unpredictable behaviour in the presence of changes (e.g. modulation) in the Reference input signal. A mathematical analysis in the book by "Best" referred to above shows that even small changes in the LPF characteristics may, in some cases, prevent the PLL from ever acquiring lock, or require an excessive time to acquire lock.

The disadvantages of very high frequency operation, as noted above, will equally apply where a moderate-frequency PLL is to be realised by building a very high frequency PLL, and passing the output through a frequency divider to achieve a moderate frequency output.

U.S. Pat. No. 4,538,282 discloses a PLL which utilises the so-called "digital VCO" concept, whereby the adjustable frequency from the VCO is obtained by passing a constant, high-frequency input through a variable frequency-divider circuit. The output frequency is then the original high frequency divided by the modulus of the divider circuit. Such a system suffers from two potential drawbacks, namely that a separate high-frequency clock source is necessary and that the output frequency will never (except fortuitously) be exactly correct, since the divider modulus is constrained to be a numerical integer. Hence the output frequency typically hovers above and below the desired value. For many applications (e.g. data recovery in communications systems) this inaccuracy can be tolerated. However, if the PLL output is intended (for example) to serve as the carrier frequency for a radio transmitter, a pure frequency is required.

Other prior art PLL circuits have required additional external components to control the operating frequency of the VCO and/or to determine the operation of the LPF. Known PD circuits (suited to VLSI implementation) have been fabricated from various arrangements of digital logic gates, and are described in the book by "Best" referred to above. Such circuits generate an output, representing the analogue phase error, as a pulse-width modulated (PWM) digital waveform, which is converted to an analogue voltage by the integrating action of the LPF. As the loop approaches correct lock, this error reduces towards zero, represented in the PWM signal by a train of increasingly narrow pulses. It can be shown mathematically (by use of standard Fourier transforms) that such pulse-trains are equivalent to a set of sinusoidal waveforms, containing increasing amounts of energy at higher and higher frequencies, as the pulses become narrower. The required LPF circuit is commonly fabricated from resistors and capacitors external to the VLSI chip since, at low and moderate frequencies, these components require values too large for practical VLSI implementation.

An alternative form of LPF, suited to VLSI implementation, is the so-called Switched-Capacitor Filter (SCF). This type of circuit is described in such texts as 'Switched Capacitor Circuits' (Allen & Sanchez-Sinencio, Van Nostrand, 1984). Such circuits have, however, an inherent limit on the maximum signal frequency they can process. This limit is described by the 'Nyquist Sampling Theorem', which states that such circuits cannot process signals containing energy components at frequencies above one-half of the frequency at which the filter is itself clocked.

The foregoing discussion demonstrates that the logic-gate type of PD, and the SCF, are mutually incompatible since, as exact synchronism is approached, the logic-gate PD generates increasingly narrower output pulses and hence increasing output energy at progressively higher frequencies. Eventually, such frequencies will exceed the "Nyquist Limit" (as described above) of the SCF, and the output from said SCF will no longer correctly represent the input signal. The practical result is that such a PLL develops an output which "hunts" about the correct frequency, in a similar manner to the "digital VCO" concept described above.

The solution generally adopted in prior art PLL products (e.g. the Motorola MC4046 integrated PLL, and others) has been to retain the logic-gate PD, and to fabricate the LPF from discrete components, external to the chip, as described. This of course defeats the goal of integration, or at least total integration.

A further use of external components, in prior art PLL designs, has been in the VCO circuit. The reason for their use here, is that passive components (resistors and capacitors) fabricated on VLSI chips, are subject to very wide manufacturing tolerances (up to 4 to 1). [These wide tolerances are a further reason why conventional resistor/capacitor LPF circuits are unsuitable for VLSI implementation, necessitating SCF circuits.] This translates into a wide spread in the VCO's characteristics, which greatly adds to the difficulties of PLL circuit design. By contrast, discrete components with tolerances as low as 1% are readily available from normal commercial sources. These external components (including the processes of attaching them to the circuit) can greatly add to the cost of a completed product and substantially limit product miniaturisation.

A SCF may be employed to act both as PD and LPF, in phase-sensitive circuit designs. The elements of a PLL according to this principle are disclosed in "Allen & Sanchez-Sinencio" referred to above, who do not however, disclose the realisation of such a circuit. In particular, the simple two-capacitor SCF shown therein, is inadequate for use in many practical PLL designs.

This simple type of PLL is unsuitable for a fully-integrated embodiment, due to the manufacturing tolerances aforesaid. These will result in a large spread in the initial VCO frequency (when the reference input is first applied). Should this frequency deviate too far from the correct value, a "false lock" condition may result. One such situation may cause the SCF, which may be clocked by the VCO, to sample non-adjacent cycles of the input signal. In such a case, the SCF will still "see" a steady DC value, and the PLL will reach a stable operating point with the VCO running at one-half its intended frequency. In practice, there are many more such "false lock" situations, which must be carefully avoided. The presence of these "false locks" has detracted from the usefulness of this PLL configuration in prior art.

OBJECTS OF THE INVENTION

An object of the present invention is to provide a PLL circuit which alleviates some or all the disadvantages of the prior art.

A further object of the present invention is to provide a PLL circuit capable of being totally embodied (integrated) within a MOS (Metal-Oxide-Semiconductor) silicon "chip".

A further object of the present invention is to provide a design, relating to PD and to VCO design respectively, used together or separately, tending to eliminate the need for some or all the aforesaid external components, thus permitting the entire PLL circuit to be fabricated on a single VLSI chip.

It is a further object of the invention to provide a PLL circuit adapted to operate up to moderate frequencies (up to a few tens of Megahertz).

It is a further object of the invention to provide a PLL circuit being substantially free of the aforementioned "false lock" problems.

DESCRIPTION OF THE PRESENT INVENTION

The present invention provides an integratable phase locked loop (IPLL) comprising a sampled data filter means adapted to receive a first reference signal, the filter means sampling the first reference signal to provide a second reference signal, and voltage or current controlled oscillator (VCO) means adapted to receive said second reference signal, the second signal serving to regulate the frequency of oscillation of the oscillator, the oscillator providing as an output a digital signal which is fed back to the filter means to provide a clock signal for said sampling.

The IPLL may be substantially totally integratable.

The present invention may provide a frequency divider or counter arranged to inter-couple the input of the sampled-data filter and the output of the VCO. The divider may be programmable or predetermined such that the IPLL of the present invention serves to function as a frequency multiplier.

The present invention may provide a calibrator arranged to inter-couple the sampled-data filter output and VCO input. The calibrator may serve to adjust or set the VCO, so as to compensate said VCO for the effects of wide manufacturing tolerances, on the components used therein, and to determine the VCO input/output characteristic.

The IPLL of the present invention may include any known VCO and/or sampled-data filter. The type of VCO and/or filter used may be determined by the particular VLSI implementation or IPLL application. The sampled-data filter may comprise any known SCF and integrator.

The present invention may further provide a combination comprising an integratable sampled-data filter and VCO, wherein the filter receives and samples an input signal and provides as an output a VCO control signal and further wherein the VCO output is fed back to the filter for use as a sampling clock signal.

Preferred embodiments of the present invention will now be herein described with reference to the accompanying drawings, wherein.

Figure 1:
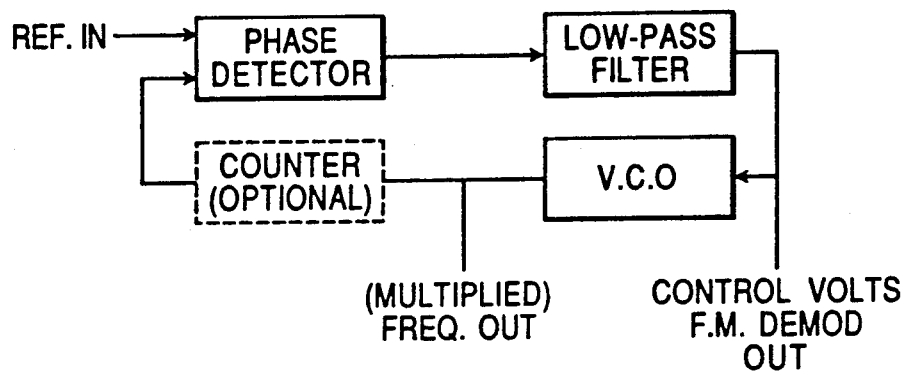
FIG. 1 shows a prior art PLL arrangement.

The IPLL is capable of fabrication on conventional MOS (Metal-Oxide-Semiconductor) silicon "chips", requiring no special processes or methods, at minimum cost.

The IPLL is inherently tolerant to the wide variations in component values which commonly occur in VLSI "chip" manufacture due to manufacturing tolerances. This minimises manufacturing cost.

The IPLL allows the characteristics both of the VCO and the LPF to be closely controlled, so providing highly predictable PLL characteristics.

The IPLL is capable of generating a substantially spectrally pure output, that is, whose output frequency is substantially constant, rather than hovering about a "correct" value.

The present invention relies on the ability of a SCF circuit to perform the duties of a PD in addition to its primary filtering function. The use of a SCF in this mode may be understood when it is recalled that the SCF, like all other sampled-data circuits, operates by taking a "snapshot" of its input signal at regular instants in time, and then processing these "snapshots". If such regular "snapshots" are taken of an object describing some form of periodic motion (e.g. rotation), a situation arises similar to that of the well-known stroboscope, or automotive engine timing-light. If the samples ("snapshots") are taken at a rate equal to that of the object's periodic motion, the object may appear stationary, since the object is in the same position when each sample is taken. Further, if said input signal is of a substantially continuous form (e.g. sinusoidal or triangular, but not rectangular pulses), any variation in the instant of sampling will manifest as a change in the "apparent" DC voltage seen by the SCF. The device therefore exhibits a phase-sensitive characteristic.

The electrical analogy of this is a periodically varying electrical signal, which is then sampled at regular intervals. Since such regular sampling is a characteristic of the SCF's normal operation, it is apparent that such action will occur when an input signal, varying at the same rate as the SCF is itself being clocked, is applied to the SCF. The SCF, effectively samples the same instant on successive cycles of the input waveform, will therefore "see" a constant DC voltage at its input. Further, if said input signal is of a substantially continuous form (e.g. sinusoidal or triangular, but not rectangular pulses), any variation in the instant of sampling will manifest as a change in the "apparent" DC voltage seen by the SCF. The device therefore exhibits a phase-sensitive characteristic.

The IPLL of the present invention includes a sampled-data filter, or a filter which operates in a strobic manner. The sampled-data filter operates to stroboscopically 'see' an input signal; i.e. the filter samples the input signal at points in time determined by a clock signal. If the frequency of (clock) sampling is substantially equal to the frequency of the input signal, the filter will "see" a DC signal.

An Integratable Phase Detector (PD)

Figure 3:
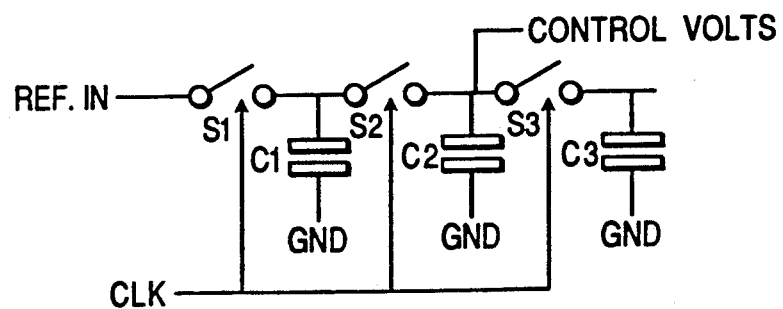
FIG. 3 shows a preferred form (only) of sampling filter.

In a SCF, a "resistor" may be simulated by a capacitor interjacent between two (transistor) switches. Such a "resistor" when coupled with an additional capacitor provides a simple LPF. The characteristics of such a SCF depend on the ratio of size of capacitors used rather than their actual capacitive value. The frequency at which the (transistor) switches are cycled is also of importance to the SCF characteristics. As shown in FIG. 3, S1, S2 and C1 provide a "resistor" and in conjunction with C3, provide an LPF, as aforementioned. The additional capacitor and switch (C2 & S3) provide a phase-advance characteristic in the SCF, such phase-advance serving to improve the damping of the complete PLL, causing it to acquire lock (upon application of a suitable reference signal more rapidly. A control voltage output can be taken from C2, rather than (in accordance with usual SCF practice) from the end of the chain, at C3. The sampling of the input signal is accomplished via any one of or all switches S1, S2, S3. (Preferably S1, S3 are operated substantially in unison, but in opposition to S2. Further, the switches should preferably be so controlled, that at no time are all three closed simultaneously).

Figure 2:
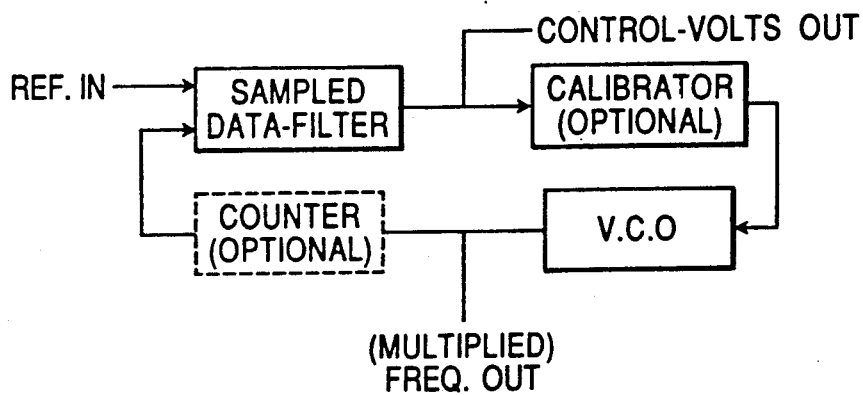
FIG. 2 shows an IPLL according to the present invention.

With reference to FIGS. 2 and 3, the input to the IPLL can be a signal of a continuous form, i.e. an analog signal. If the input signal has a frequency substantially equal to the SCF clock frequency, the filter may 'see' a substantially constant DC voltage (by a process similar to that of an optical stroboscope, as hereinbefore described). The DC voltage 'seen' may depend upon the point(s) in time at which the input signal is sampled. In this way, an SCF may form an ideal sampled-data filter.

The output of the filter (control volts), provides an input signal, or controlling signal, for the VCO of the IPLL. The output signal or oscillation of the VCO can be used to provide the CLK signal for the SCF which enables sampling in the sampled-data filter.

In order to alleviate the above-mentioned 'false lock' problem, the PLL can be arranged to enter a "set-up" mode when a new reference signal is applied. In this mode, the LPF output is forced to a specific value, and the VCO frequency is brought approximately to some predetermined value, by a coarse adjustment, as more fully described below. One or more such adjustments may be performed before the PLL is enabled to seek final lock. This method is especially effective in cases where the PLL is required to function as a frequency multiplier, since the frequency divider may be utilised to perform the coarse-lock function.

Any suitable form of counter or divider may optionally be fed by the VCO output in order to provide the sampled-data filter with a reduced clock frequency. The IPLL can then function as a frequency multiplier, the multiplied frequency output being proportional to the division provided by the counter. The PLL of FIG. 2 includes such an (optional) counter.

Figure 4:
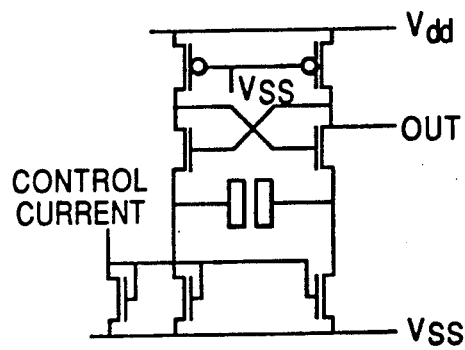
FIG. 4 shows a preferred form (only) of VCO.

A known form of VCO is shown in FIG. 4, being a Source-Coupled Multivibrator. (Note that, following usual practice, the circuit is still referred to as a VCO [Voltage-Controlled Oscillator], notwithstanding it is in fact, current controlled. The term Current-Controlled Oscillator is not often used.)

A calibrator may be optionally provided with the IPLL as shown in FIG. 2. The caliabrator serves to alleviate 'false lock'. The following describes two preferred methods and preferred apparatus of the calibrator.

Calibrator: First Embodiment (See FIGS. 5 and 6)

The underlying principle of the VCO calibration process may be found in Analytical Geometry. The objective is to define the characteristic (i.e. the graph of Output Frequency versus Control Voltage/Current) of the VCO. Without calibration, this characteristic may be subject to very wide manufacturing tolerances, as noted above.

Given that the characteristic of the VCO approximates somewhat a straight line (at least over the span of practical interest), it is sufficient to determine two points on that line, for the entire line to be determined. The calibrator operates by determining two such points, near the lowest and highest frequencies at which the VCO is required to operate.

A calibrator and method may adjust the performance of a Voltage (or current) Controlled Oscillator, and may compensate for manufacturing tolerances in circuit parameters. This can be advantageous in an IPLL due to possible wide production spreads of VLSI characteristics. Wide production spreads may result in a wide variation in sensitivity of the VCO circuit (its frequency, as a function of the controlling voltage/current). This can reduce the IPLL's accuracy or cause "false locking" as described above.

The principle is that the control voltage can be processed by a calibrating stage before being applied to the VCO circuit. This calibrator may have one or two programmable or setable parameters; its gain and/or its bias or offset, which may be added to the output value. The transfer function of the circuit may be:

equation 1: $Vo = Bias + Vin \times Gain$ where $Vo =$ output; $Vin =$ Input.

The calibration process assigns value(s) to the gain and/or the bias. This can preferably be done by providing any form of known sequential logic controller (such as a State Machine, or a Microprogrammed Controller), which executes a calibration procedure at start-up. In practical designs, such a sequential controller may also be needed for other purposes, and the calibration function may conveniently be assigned to existing circuitry, by the addition of some extra "programming". (For convenience, the process of determining the operating algorithms of the controller will be described as "programming", without prejudice as to the actual controller implementation i.e. the programming may be accomplished via hardware, firmware or software or a combination thereof).

The calibration circuitry provides means to override the output of the filter, and force the filter's output signal to either a minimum or a maximum value. The gain and bias inputs may be conveniently provided as digital signals or data sourced from a counter or register under the control of a sequential controller or may be provided via other convenient means.

A counter means (frequency counter FC) can also be provided as an option, which may be clocked by the VCO output, and which may be examined by the sequential controller, and may alter the "program's" flow of control and/or be utilised as data by such program. When the IPLL is used as a frequency multiplier, the FC may conveniently be the pre-scaling divider hereinbefore described.

The sequential controller may be clocked (at least, during the calibration process) from the IPLL's "reference" input signal, (see FIG. 2) which is assumed to be of known frequency. Alternatively, another clock source of known frequency may be provided. Hence the time required to execute each "instruction" of the controller, is known.

Given the general calibrator and method outline described above, the calibration procedure may be as follows (implemented by commands from the sequential controller).

The minimum frequency can be set by inducing the filter's output to a LOW condition, approximately to zero volts. Hence, using equation 1, the output of the calibrator may simply be the value of the bias input. The bias input can be derived from a counter or similar device, directed by the controller. The controller may pre-load this counter or register mean, with either a minimum or maximum value, as required. It may then preset the FC, and permit the VCO to increment the FC for a known number of controller "instruction" times (hence a known period). The count remaining in the FC after this time can then be tested by the controller, which then determines whether the VCO output frequency is above or below a set point.

If, for example, we commenced by loading zero into the bias control bit register, we can expect the VCO frequency to be low. While the frequency is low, we may proceed to increment the bias register, and repeat the aforementioned FC count test. When the set point is reached the VCO lower limit has been set. If we elected to initialise the bias register to a maximum value, we may expect an initially high VCO frequency, and can reduce the bias value until the set point is reached.

An alternative, faster, method of setting the register bits, in the "successive approximation" method commonly used in Analogue-to-Digital Converters. The process begins by setting all register bits to zero (assumed to represent minimum VCO frequency). The most significant register bit is then set to one, and the VCO frequency is tested as described above. If the frequency is found to be too high, the register bit is reset to zero. The next lower significance register bit is then set to one, and the process repeats until all bits have been set or reset as is required.

The maximum frequency setting may be similar to the minimum frequency setting but the previously set bias value can be retained and the filter output can be forced to a maximum value. A similar process to that described above can adjust the gain, to see the VCO's intended maximum frequency.

Having set one or two operation limits of the VCO's control span for a particular application of the IPLL, the VCO's sensitivity may be determinable, since it is known to be substantially linear, and two points on that line (in frequency and voltage) have just been determined. We may now enable the filter output, and allow the PLL to seek final lock.

Figure 5:
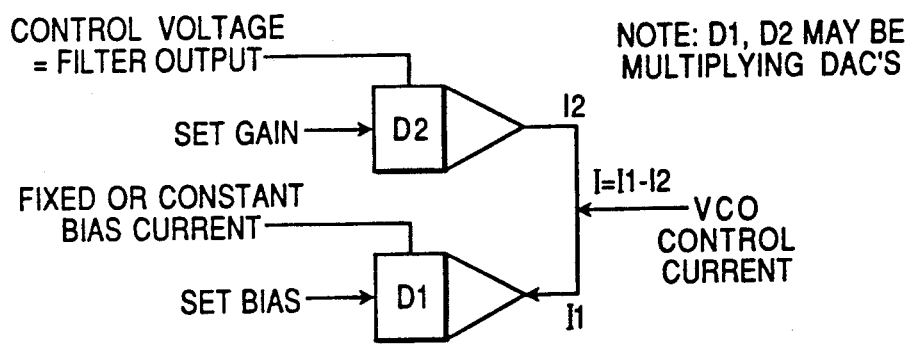
FIG. 5 shows a calibrator (optional) in block diagram form.
Figure 6:
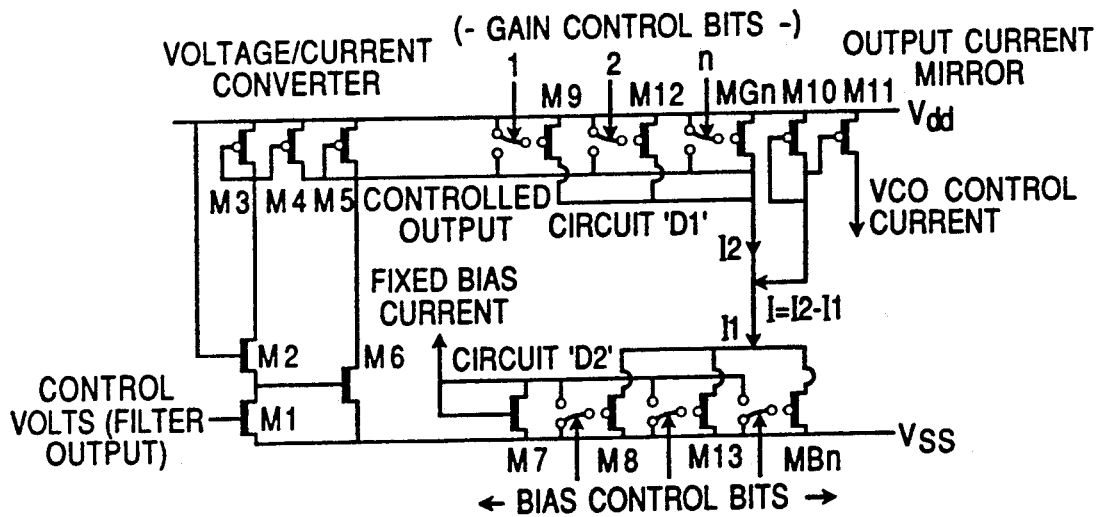
FIG. 6 shows a preferred form (only) of calibration arrangement.

A preferred embodiment of calibrator is shown in FIGS. 5 and 6 of the accompanying drawings. The drawings show the operation of the controlled buffer stage only: the design of digital circuits (Sequential Controllers, Counters, etc.) is well known: details are available in many standard texts (such as Introduction to VLSI Systems, Mead & Company, Addison-Wesley 1980). The illustrated embodiment assumes a CMOS fabrication process, however other MOS processes (for example NMOS or PMOS) could also be used.

The embodiment predominantly makes use of the so-called "current mirror" circuit. This is a well-known device, for developing multiple current sources (or sinks), as accurately known multiples of a given input current. Familiarity with this standard circuit is assumed.

With reference to FIG. 5, the calibrator is implemented as two, Digital-To-Analogue Converters (DAC). These circuits have the property of generating an output current, which is proportional to a digital input value. D1 is a simple DAC of this type. D1 in practice may comprise a "multiplying DAC", having one input fixed. D2 may be a "multiplying DAC", in which the output current is proportional to the product of the digital input as aforesaid, and of an additional (analogue) input.

The filter of FIG. 2 may generate a voltage output, and therefore a Voltage-to-Current conversion function is required to drive the DAC's. In the circuit of FIG. 6, the current through M5 is inversely proportional to the voltage input at M1, for values between the transistor threshold voltage Vte, and Vdd/2. Because of this inverse relationship, the output of the two DAC's can be subtracted rather than added. In FIG. 6, the controlled output signal can feed the gates of further transistors, having a current mirror arrangement, replicating in proportion the current through M5. This circuit is embodied within the Multiplying DAC, D2.

A preferred form of DAC is shown in part of FIG. 6. Transistors M9, M12, MGn provides gas in value and represent the first, second, nth gain control bit respectively. M8, M13, MBn provide bias values and represent the first, second nth bias control bit respectively. There are as many transistors as there are bits required. The more bits, the more the precision setting or adjustability, however, calibration time is proportional to the number of bits. Practically, three or four bits provides sufficient accuracy and adjustability. The illustration of FIG. 6 provides 3 bits of control, as an example only.

The significance of a bit may depend on the width-/length ratio of the transistors. For example, if M13 is twice the size of M8, the M13 bit has twice the significance of the M8 bit, and so on. The same may apply for the gain control. Assuming M7 is of substantially the same width as M8, and each succeeding transistor is twice the width of its predecessor then, I1=fixed bias current×binary weighted value of bias control bits.

Considering the D2 circuit, in FIG. 6, transistor M9 may form the second half of a current mirror, when its gate is fed from bias out (M5). Hence the current I2 is multiple of current through M5 (the multiple being as the size ratio of M5 and M9). As aforementioned, there may be multiple M9 switch/transistor pairs, controlled by the several bits of the gain input. Hence, the current I2 may be proportional to the current through M5, multiplied by the binary weighted value of the gain bits. This constitutes a multiplying DAC, whose output is inversely proportional to the control voltage (Vin). Vin can be the sampling filter output (optionally forced low or high, as described above).

The other DAC, D1, may be formed by M8, M13, MBn transistor array and may operate substantially identically, except that is input control current has a fixed value. The current I1 hence is proportional to the binary bias value. The difference I1−I2 can be taken, and fed via the current mirror M10/M11, to the VCO input as an oscillation frequency controlling current.

Because of the inverse relationship at D2, the calibration process outlined above may be modified slightly. It may be assumed that the VCO has a direct, not inverse, current/frequency control characteristic. Vin may be forced to a maximum and because of this inverse characteristic of the D2 voltage/current converter circuit, the bias out signal may reduce to zero. Hence, I2 is almost zero.

Adjusting the bias, as described above, adjusts I1 to bring the VCO to its maximum frequency. If bias is held constant, Vin may be set to zero and brings I2 to a maximum value having regard to the current value of the gain input. This reduces the value I1−I2, and the VCO output can then vall. Adjusting the gain can now bring the VCO to a correct minimum frequency i.e. setting I2. The VCO is now substantially calibrated and the IPLL can now be activated and allowed to "lock".

Figure 7:
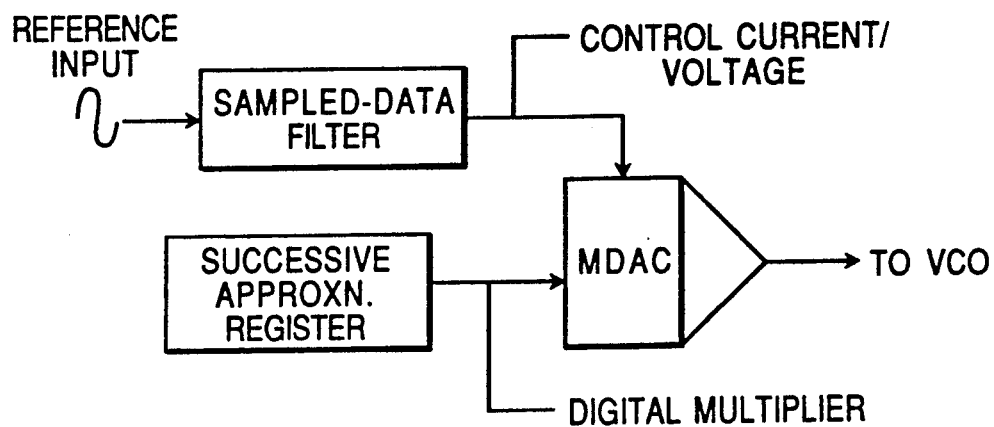
FIG. 7 shows an alternative preferred form of calibration.
Figure 8:
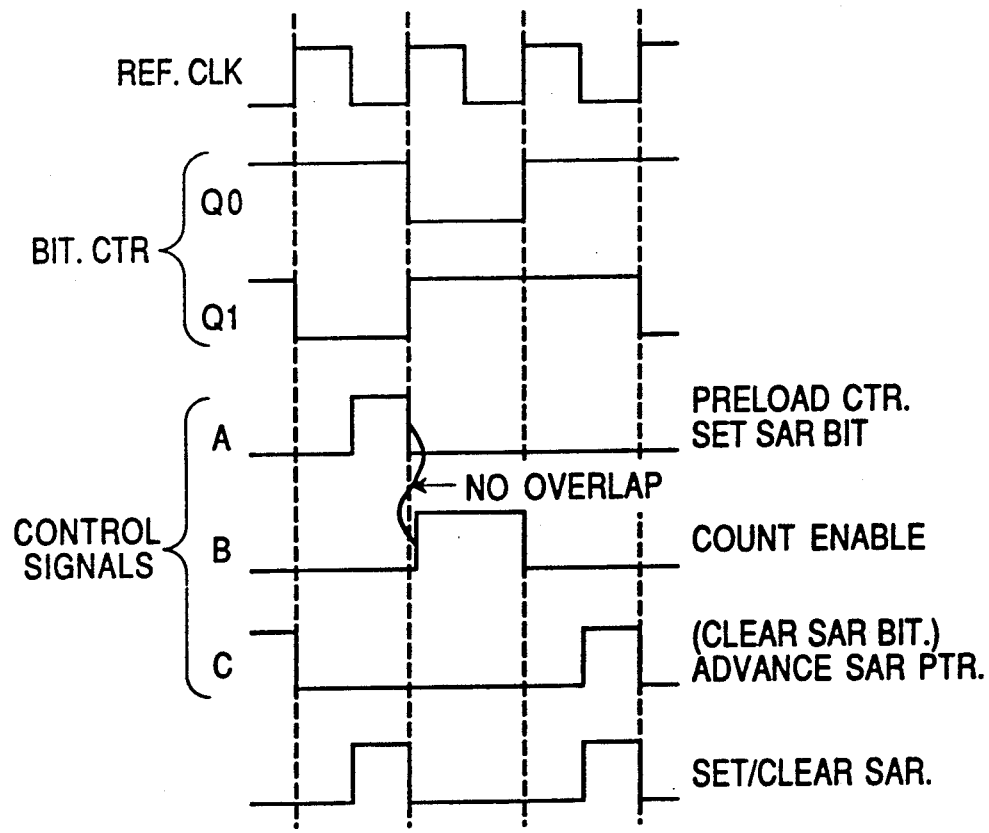
FIG. 8 shows the timing of operations for the calibration function of a discrete component test circuit of the present invention.
Figure 9:
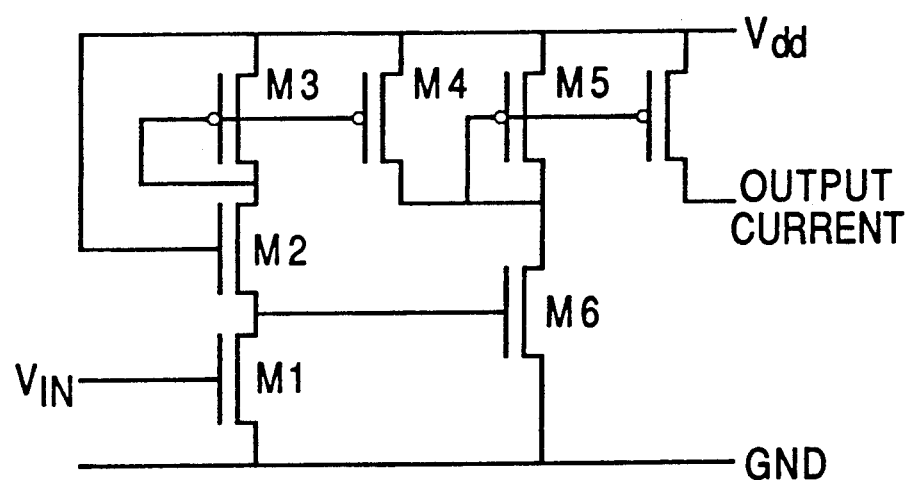
FIG. 9 shows a Voltage to Current Converter, according to prior art.

Calibrator: Second Embodiment (See FIGS. 7 to 9)

The calibrator hereinafter described generally requires less circuitry than that of the first embodiment, but it does require a VCO circuit having an inherently linear control characteristic, essentially down to approximately zero frequency. The multivibrator circuit aforementioned for example, exhibits this property, as do many others which are also known. Given this, the first calibration point is implicitly provided at the zero current/frequency point, requiring only a single calibration step, to set the characteristic. In effect, the characteristic is allowed to pivot about the zero "point" until it intersects the required calibration point. Conveniently, this (single) calibration point will be located as close as possible to the final (i.e. in-lock) intended VCO frequency.. This is accomplished quite simply, in the following manner:

The control voltage (from the filter) is multiplied by a constant, before being applied to the VCO. This constant is adjusted during the self-calibration process. The use of a multiplicative, rather than additive, adjustment serves also to stabilise the VCO's sensitivity function (i.e. the slope of its response).

A variation of this second embodiment is also possible, wherein instead of multiplying the control voltage (or current) by an adjustable factor, the timing capacitor(s) in the VCO circuit itself is similarly adjusted. Since the VCO frequency is determined by the combination of the control current and the timing capacitance, the effect is the same. In the VCO of FIG. 4, this might be done by replacing the single capacitor shown, by a plurality of capacitors each in series with a suitable (transistor) switch, such capacitor/switch pairs being connected in parallel, in place of the original capacitor. If these plurality of capacitors are of suitably varied sizes, the associated switches may be operated in a manner similar to that aforesaid.

A prototype discrete component form of the PLL according to the present invention was made from conventional (discrete) components in order to test the aforementioned described circuit. The majority of the circuit was built from bipolar TTL components, with CMOS used for the analogue switches (used in the SCF circuits), and their drivers. The operation of the self-calibrator is similar to that of a successive-approximation analogue to digital converter. It accepts a reference signal AC-IN, at 132 kHz sinusoidal, 10 V peak to peak. The 132 kHz logic clock, REF, is developed from this, by the sine to square waveform converter.

The prototype PLL acquired lock (after completion of the calibration function) in under 300 micro-seconds, over a reference frequency range of 115-150 kHz (the design frequency is 132 kHz). With only 5 bits active, the acquisition range reduced to 123-148 kHz.

Sinusoidal FM was recovered from 50-2500 Hz, for Reference input frequency deviations of ±450 to ±2000 Hz. Improved performance is anticipated in the contemplated embodiment of the present invention i.e. fully integrated PLL. A substantially MOS process is contemplated for the IPLL.

The claims defining the invention are as follows:

1. A totally integratable phase locked loop (IPLL) comprising
    sampled data filter means adapted to receive a first reference signal, the filter means sampling the first reference signal to provide a second reference signal, voltage or current controlled oscillator means (VCO) adapted to receive said second reference signal, the second signal serving to regulate the oscillation frequency of the oscillator means, the oscillator means providing an output digital signal which is fed back to the filter means to provide a clock signal for said sampling, and calibrator means inter-coupling the filter means and the oscillator means, the calibrator means serving to set gain or bias for determining output/input characteristic of the oscillator means.

2. An integratable phase locked loop (IPLL) comprising sampled data filter means adapted to receive a first reference signal, the filter means including a switched capacitor filter (SCF), the filter means sampling the first reference signal to provide a second reference signal, voltage or current controlled oscillator means (VCO) adapted to receive said second reference signal, the second signal serving to regulate the oscillation frequency of the oscillator means, the oscillator means providing an output digital signal which is fed back to the filter means to provide a clock signal for said sampling, and calibrator means inter-coupling the filter means and the oscillator means, the calibrator means serving to set gain or bias for determining output/input characteristic of the oscillator means.

3. An IPLL as claimed in claim 1 or 2, wherein the filter means stroboscopically samples the first reference signal.

4. An IPLL as claimed in claim 1 or 2 or 3, being fabricated using substantially MOS technology.

5. An IPLL as claimed in claim 1 or 2, further comprising counter or divider means adapted to receive the digital signal and provide to the filter means a divided or multiplied clock signal, the IPLL providing a multiplied frequency output from the VCO.

6. An IPLL as claimed in claim 1 or 2, being adapted for operation at low or moderate frequencies.

7. An IPLL as claimed in claim 1 or 2, wherein the second reference signal is a substantially spectrally pure (single frequency) output signal.

8. An integratable phase locked loop (IPLL) comprising sampled data filter means adapted to receive a first reference signal, the filter means sampling the first reference signal to provide a second reference signal, voltage or current controlled oscillator means (VCO) adapted to receive said second reference signal, the second signal serving to regulate the oscillation frequency of the oscillator means, the oscillator means providing an output digital signal which is fed back to the filter means to provide a clock signal for said sampling, and calibrator means inter-coupling the filter means and the oscillator means, the calibrator means serving to set gain or bias for determining output/input characteristic of the oscillator means, wherein the calibrator means includes at least one digital to analogue converter and further wherein the characteristic of the VCO is determined over the range operating frequencies of the IPLL.

9. An IPLL as claimed in claim 8, wherein the calibrator means includes two digital to analogue converters, one of which is adapted to set the gain, the other of which is adapted to set the bias.

10. An IPLL as claimed in claim 8 or 9, wherein the calibrator means further includes a register adapted to multiply the second reference signal by a constant.

11. An integratable phase locked loop (IPLL) comprising sampled data filter means adapted to receive a first reference signal, the filter means sampling the first reference signal to provide a second reference signal, voltage or current controlled oscillator means (VCO) adapted to receive said second reference signal, the second signal serving to regulate the oscillation frequency of the oscillator means, the oscillator means providing an output digital signal which is fed back to the filter means to provide a clock signal for said sampling, and calibrator means inter-coupling the filter means and the oscillator means, the calibrator means serving to set gain or bias for determining output/input characteristic of the oscillator means, wherein capacitor/switch pairs are provided in association with the VCO in order to influence the characteristic of the VCO.

12. An integratable phase locked loop (IPLL) comprising sampled data filter means adapted to receive a first reference signal, the filter means including a switched capacitor filter (SCF), the filter means sampling the first reference signal to provide a second reference signal, voltage or current controlled oscillator means (VCO) adapted to receive said second reference signal, the second signal serving to regulate the oscillation frequency of the oscillator means, the oscillator means providing an output digital signal which is fed back to the filter means to provide a clock signal for said sampling, and calibrator means inter-coupling the filter means and the oscillator means, the calibrator means serving to variably set slope and gain or bias for determining output/input characteristic of the oscillator means.

* * * * *